United States Patent
Li et al.

(10) Patent No.: US 12,312,668 B2
(45) Date of Patent: May 27, 2025

(54) MASK PLATE AND METHOD FOR PERFORMING EVAPORATION BY USING THE SAME

(71) Applicants: Chengdu BOE Optoelectronics Technology Co., Ltd., Sichuan (CN); BOE Technology Group Co., Ltd., Beijing (CN)

(72) Inventors: Qian Li, Beijing (CN); Jia Zeng, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 584 days.

(21) Appl. No.: 17/637,974

(22) PCT Filed: Mar. 10, 2021

(86) PCT No.: PCT/CN2021/079861
§ 371 (c)(1),
(2) Date: Feb. 24, 2022

(87) PCT Pub. No.: WO2021/218411
PCT Pub. Date: Nov. 4, 2021

(65) Prior Publication Data
US 2022/0275496 A1 Sep. 1, 2022

(30) Foreign Application Priority Data
Apr. 27, 2020 (CN) .......................... 202010344381.0

(51) Int. Cl.
C23C 14/04 (2006.01)
C23C 14/24 (2006.01)
(Continued)

(52) U.S. Cl.
CPC ............ *C23C 14/042* (2013.01); *C23C 14/24* (2013.01); *H10K 50/82* (2023.02); *H10K 59/8052* (2023.02); *H10K 71/60* (2023.02)

(58) Field of Classification Search
CPC ..... C23C 14/042; H10K 71/166; H10K 71/00
See application file for complete search history.

(56) References Cited

U.S. PATENT DOCUMENTS

2015/0303399 A1   10/2015   Cui et al.
2018/0040855 A1*   2/2018   Chen ...................... H10K 71/00
2020/0357998 A1   11/2020   Bai et al.

FOREIGN PATENT DOCUMENTS

CN           103187432 A          7/2013
CN           104123904 B    *     3/2017    .......... G09G 3/2003
(Continued)

OTHER PUBLICATIONS

CN 202010344381.0 first office action.
PCT/CN2021/079861 international search report and written opinion.

*Primary Examiner* — Edward Chin
(74) *Attorney, Agent, or Firm* — IPro, PLLC

(57) ABSTRACT

A mask plate and a method for performing evaporation by using the mask plate are provided. The mask plate includes: a mask plate body including via holes arranged at intervals, wherein the via hole includes a main hole and an extension hole connected to the main hole, the main hole is configured for enabling evaporated material to penetrating therethrough, to form a pixel pattern, and the extension hole is configured for enabling the evaporated material to penetrate therethrough, to form a connection pattern for the pixel pattern, wherein two adjacent via holes arranged in the preset direction correspond to two pixel patterns that are to be formed on the substrate to be evaporated, and arranged in the preset direction at intervals.

16 Claims, 4 Drawing Sheets

(51) Int. Cl.
*H10K 50/82* (2023.01)
*H10K 59/80* (2023.01)
*H10K 71/60* (2023.01)

(56) References Cited

FOREIGN PATENT DOCUMENTS

| | | | | |
|---|---|---|---|---|
| CN | 108866476 | A | 11/2018 | |
| CN | 109023236 | A | 12/2018 | |
| CN | 110257769 | A | 9/2019 | |
| CN | 110349993 | A | 10/2019 | |
| CN | 110611054 | A * | 12/2019 | ............. H10K 50/82 |
| CN | 110993562 | A * | 4/2020 | ......... H01L 27/1214 |
| CN | 111354762 | A * | 6/2020 | ........... C23C 14/042 |
| CN | 111441013 | A | 7/2020 | |
| JP | H1050478 | A | 2/1998 | |
| WO | WO-2006064395 | A2 * | 6/2006 | ....... G02F 1/133514 |
| WO | WO-2022087906 | A1 * | 5/2022 | ........... C23C 14/042 |

* cited by examiner

MASK PLATE AND METHOD FOR PERFORMING EVAPORATION BY USING THE SAME

The present disclosure is the U.S. national phase of PCT Application No. PCT/CN2021/079861 filed on Mar. 10, 2021, which claims the priority of Chinese patent application No. 202010344381.0 filed on Apr. 27, 2020, the entire contents of which are incorporated herein by reference.

TECHNICAL FIELD

The present disclosure relates to the technical field of manufacturing a display panel, and particularly to a mask plate and a method for performing evaporation by using the mask plate.

BACKGROUND

As a new type of display technology, organic light-emitting diode (OLED) display has attracted more and more attention due to its characteristics of active light emission, high luminance, a wide viewing angle, fast response, low power consumption, and flexibility, which may be the next generation display technology taking place of a liquid crystal display.

In addition, an OLED display panel can also meet the requirements of transparent display by using characteristics of an OLED display technology. Generally, the OLED display panel include an anode, a cathode, and a light-emitting functional layer arranged between the anode and the cathode. Transmittance is an important parameter for the transparent displays. However, when the transmittance of a material for manufacturing the cathode is 50%-60%, the transmittance of the transparent display panel will be greatly reduced. In order to increase the transmittance, a patterned cathode method is generally used, wherein a cathode material only remains in a display region, and the cathode material in the transparent region is removed.

On the basis of forming a patterned cathode, the patterned cathode also needs to be overlapped with a VSS wiring via an edge region so as to realize the circulation of current, and therefore the patterned cathode needs to be arranged in the display region and also needs a corresponding overlapping bridge so as to ensure that a circuit is connected. In the prior art, in order to ensure the strength of the mask plate, and no deformation occurs when fixing a mask plate mesh, two mask plates are usually required for the preparation of the patterned cathode, and two evaporation processes are performed separately, which results in the problem of a complicated manufacturing process and waste of operation time of an evaporation machine.

SUMMARY

An object of the technical solution of the present disclosure is to provide a mask plate and a method for performing evaporation by using the mask plate, to solve the problem of the complicated manufacturing process and the waste of the operation time of the evaporation machine when using the mask plate in the prior art to perform patterned material evaporation.

An embodiment of the present disclosure provides a mask plate including:

a mask plate body including a plurality of via holes arranged at intervals, wherein the via hole includes a main hole and an extension hole, the extension hole is connected to the main hole and is parallel to a preset direction, the main hole is configured for enabling evaporated material to penetrating therethrough, to form a pixel pattern on a substrate to be evaporated, and the extension hole is configured for enabling the evaporated material to penetrate therethrough, to form a connection pattern for the pixel pattern, and the connection pattern is connected to the pixel pattern, wherein two adjacent ones of the via holes are arranged in the preset direction correspond to respective two pixel patterns, the respective two pixel patterns are to be formed on the substrate to be evaporated, are arranged in the preset direction, and are arranged at intervals;

on the mask plate body, a minimum distance between two adjacent via holes arranged in the preset direction is greater than or equal to a size of the pixel pattern in the preset direction, and is less than or equal to a maximum size of the via hole in the preset direction.

Optionally, in the mask plate, each of the extension holes protrudes in the preset direction with respect to the respective main hole that the extension hole is connected to.

Optionally, in the mask plate, a size of the extension hole in the preset direction is greater than or equal to a distance between two adjacent pixel patterns arranged in the preset direction and arranged on the substrate to be evaporated.

Optionally, in the mask plate, the extension hole includes a first extension hole and a second extension hole, the first extension hole protrudes in the preset direction with respect to the respective main hole that the first extension hole is connected to, the second extension hole protrudes in an opposite direction with respect to the respective main hole that the second extension hole is connected to, the opposite direction is opposite to the preset direction.

Optionally, in the mask plate, each of a size of the first extension hole and a size of the second extension hole in the preset direction is less than or equal to a distance between two adjacent pixel patterns arranged in the preset direction and arranged on the substrate to be evaporated.

Optionally, in the mask plate, the size of the first extension hole in the preset direction is equal to the size of the second extension hole in the preset direction.

Optionally, in the mask plate, the main hole includes a central line parallel to the preset direction, and each of the first and second extension holes is of a symmetrical structure with respect to the central line.

Optionally, in the mask plate, an inner wall surface of the first extension hole is a flat surface or an arc surface, an inner wall surface of the second extension hole is the flat surface or the arc surface, the inner wall surface of the first extension hole is distal to the second extension hole, and the inner wall surface of the second extension hole is distal to the first extension hole.

Optionally, in the mask plate, each of the via holes is of a same shape and a same size.

The embodiments of the present disclosure also provide a method for performing evaporation by using the mask plate according to any one of the above, wherein the method includes:

providing the substrate to be evaporated;

aligning the mask plate body with the substrate to be evaporated;

executing a first evaporation process to deposit, through the plurality of via holes on the mask plate body, the evaporation material on the substrate to be evaporated, and forming, on the substrate to be evaporated, a plurality of first pixel patterns arranged in columns in the preset direction and a plurality of connection patterns connected to the respective first pixel patterns;

translating the mask plate body in the preset direction by the preset distance; and performing the second evaporation process, to deposit, through the plurality of the via holes on the mask plate body, the evaporation material on the substrate to be evaporated; among the first pixel patterns arranged in each of the columns in the preset direction, a second pixel pattern and a connection pattern connected to the second pixel pattern are formed between two adjacent first pixel patterns, and the connection pattern for each of the second pixel patterns is connected to the adjacent first pixel pattern, or is connected to the connection pattern for the adjacent first pixel pattern.

Optionally, the preset distance is equal to a distance between a first central line of the first pixel pattern and a second central line of the second pixel pattern;

the first central line is a central line of the first pixel pattern perpendicular to the preset direction; and the second central line is the central line of the second pixel pattern perpendicular to the preset direction.

Optionally, the plurality of first pixel patterns and the plurality of the second pixel patterns formed on the substrate to be evaporated are combined to form a cathode layer of an Organic Light-Emitting Diode (OLED) light emitting unit.

BRIEF DESCRIPTION OF THE DRAWINGS

In order to more clearly describe the technical solutions in one or more embodiments of the present disclosure or prior art, the following will briefly introduce the drawings that need to be used in the description of the embodiments or prior art. Obviously, the drawings in the following description are only one or more embodiments of the present disclosure. For a person skilled in the art, other drawings can be obtained based on these drawings without creative work.

DETAILED DESCRIPTION

In order to make the technical problems, technical solutions, and advantages of the present disclosure clearer, a detailed description will be given below with reference to the accompanying drawings and specific embodiments.

In order to solve the problem of the complicated manufacturing process and waste of the operation time of the evaporation machine when using the mask plate in the prior art to perform patterned material evaporation, the embodiments of the present disclosure provide the mask plate, wherein the pixel patterns and connection patterns for the pixel patterns on a substrate to be evaporated can be formed by using one mask plate, which can solve the problem of the complicated manufacturing process and waste of the operation time of the evaporation machine when using two mask plates with different structures to respectively form the pixel patterns and the connection patterns in the prior art to perform patterned material evaporation.

Optionally, the mask plate described in embodiments of the present disclosure may be configured to manufacture a cathode layer of an OLED display panel. In order to clearly explain the structure and operating principle of the mask plate described in the embodiments of the present disclosure, the embodiments of the present disclosure will be described in detail below in conjunction with the description of the preparation of the cathode layer of the OLED display panel.

Figure 1:
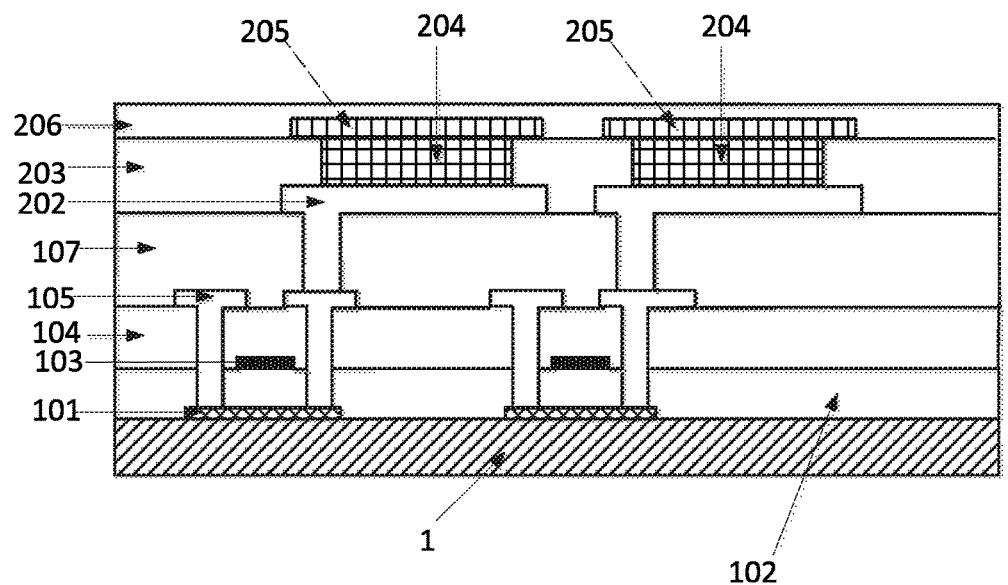
FIG. 1 is a schematic cross-sectional view of an OLED display panel provided with a patterned cathode structure.

As shown in FIG. 1, the display region of the OLED display panel includes a driving circuit layer provided on a base 1 and a light emitting device layer located on the driving circuit layer, wherein the driving circuit layer includes an active layer 101, a gate insulating layer 102, a gate electrode 103, an interlayer insulating layer 104, a source/drain electrode layer 105, and a flat layer 107 that are successively formed on the base 1, the flat layer 107 is arranged at a side of the source/drain electrode layer 105 distal to the base 1; the light-emitting device layer includes a first electrode 202, a light-emitting layer 204 arranged at a side of the first electrode 202 distal to the base 1, and a second electrode 205 arranged at a side of the light-emitting layer 204 distal to the base 1; and optionally, a spacer layer 206 is provided on the second electrode 205. In addition, the light-emitting device layer further includes a pixel definition layer 203 arranged on the first electrode 202, and the light-emitting layer 204 is arranged in the pixel definition layer 203. The first electrode 202 and the source/drain electrode layer 105 are connected through a via hole of the planarization layer 107, a driving voltage is input to the first electrode 202 through a driving circuit layer, and the light-emitting layer 204 can be driven to emit light by a voltage difference between the first electrode 202 and the second electrode 205.

In the embodiments of the present disclosure, optionally, the first electrode 202 is an anode and the second electrode 205 is a cathode. The light-emitting layer 204 includes a hole injection layer, a hole transport layer, a light-emitting layer, an electron transport layer, and an electron injection layer, which are provided in sequence.

In the structure of the OLED display panel, the second electrode 205 of the whole display region is connected to a VSS wiring of the display panel, so as to realize the circulation of current. For easily manufacturing, the second electrodes 205 of an entire display region is generally arranged in the form of a full-surface structure, that is, the second electrodes 205 corresponding to different pixel units are all connected in an integral structure. However, when a transparent OLED display panel is manufactured using the second electrode in this structural form, the transmittance of the material for manufacturing the second electrode is 50%-60%, which will greatly reduce the transmittance of the transparent display panel. In order to improve the transmittance, a patterned cathode method is generally used, wherein the cathode material only remains in the pixel region, and the material of the second electrode 205 in the transparent region between the pixel regions is removed, as shown in FIG. 2, on the substrate 50 to be evaporated, the electrode layer of the manufactured second electrode 205 includes the pixel patterns 20 corresponding to the pixel unit 10 and the connection patterns 30 connected between the adjacent pixel patterns 20, and the respective pixel pattern 20 is connected to the VSS wiring 40 through the connection patterns 30 so that the manufactured pixel patterns 20 are electrically connected.

By adopting the mask plate according to the embodiments of the present disclosure, the pixel patterns and the connection patterns on the substrate to be evaporated can be formed by a single evaporation process, so as to achieve the effect of simplifying the evaporation process and saving evaporation time of the evaporation machine.

Figure 2:
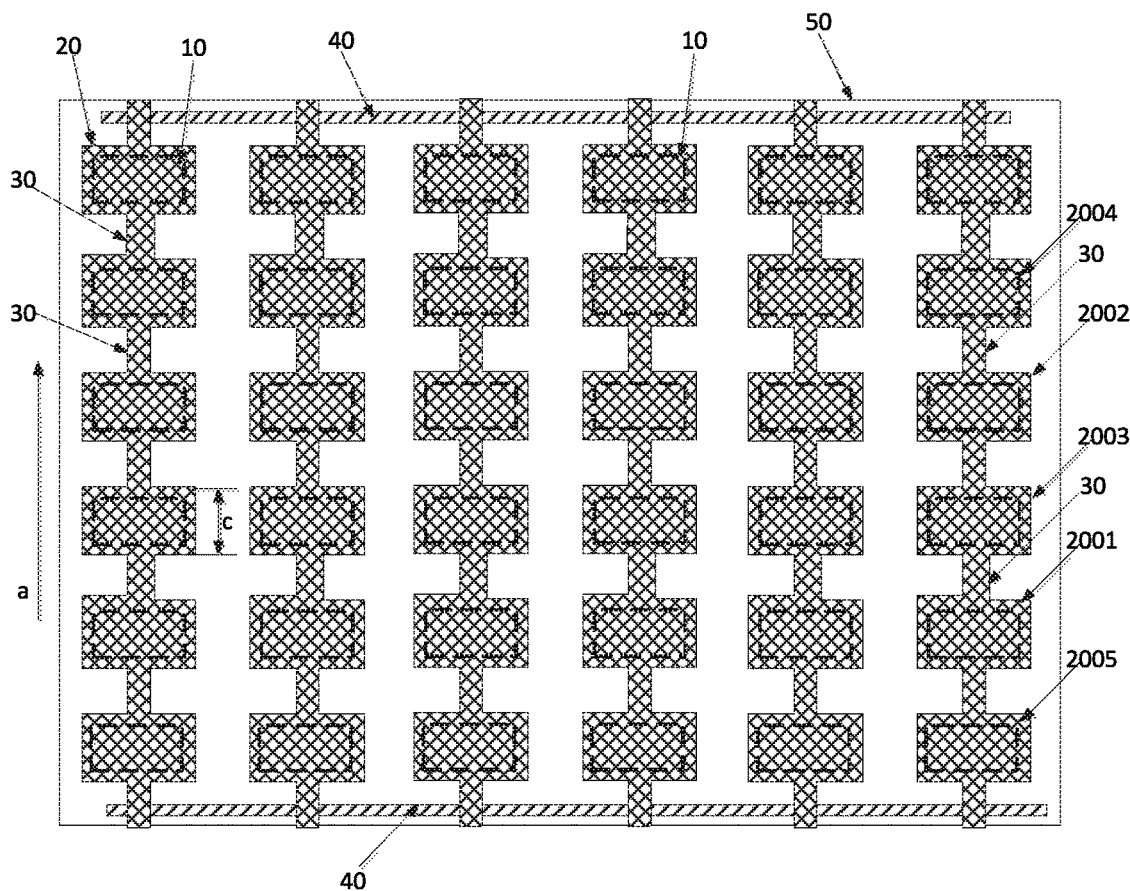
FIG. 2 is a schematic plan view of a patterned cathode structure.
Figure 3:
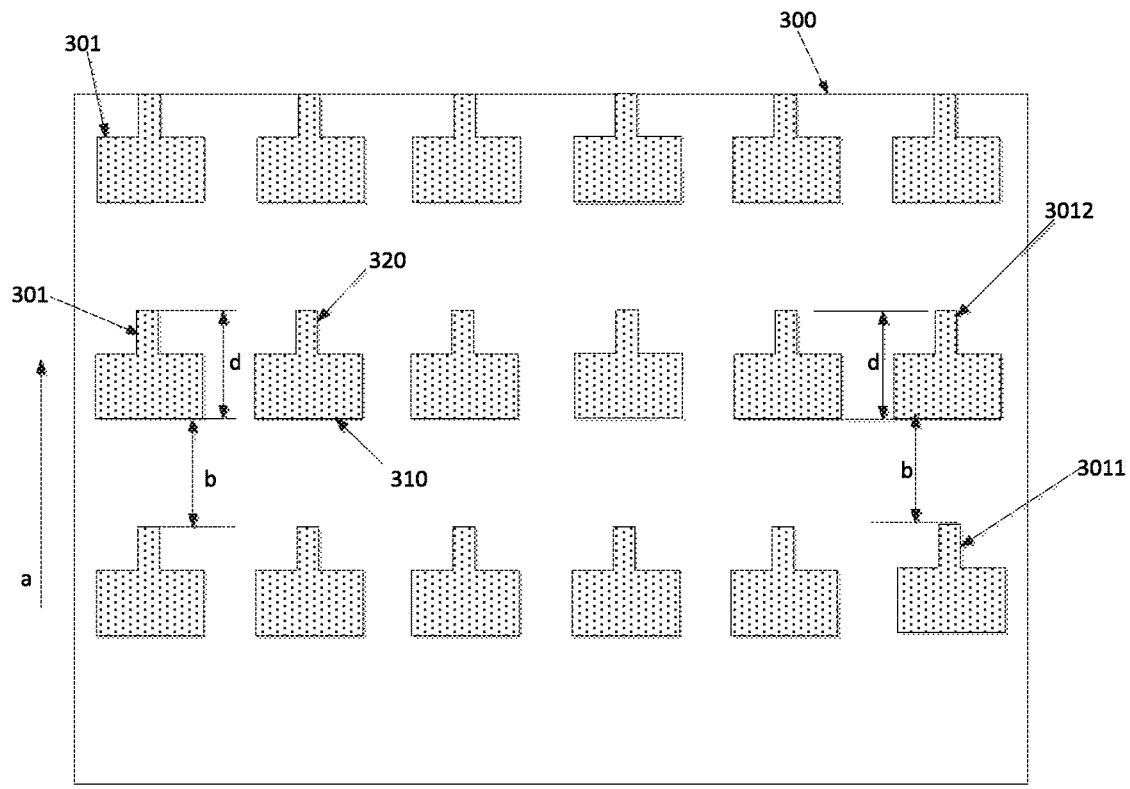
FIG. 3 is a schematic structural diagram showing the mask plate according to an implementation of the embodiments of the present disclosure.

Specifically, in an implementation of the mask plate according to the embodiment of the present disclosure, as shown in FIG. 3, combined with FIG. 2, the mask plate includes:

- a mask plate body 300, which includes a plurality of via holes 301 distributed at intervals, the via holes 301 are configured for penetrating therethrough an evaporation material to form pixel patterns 20 on a substrate to be evaporated and connection patterns 30 parallel to a preset direction a, and the connection patterns 30 are connected to the pixel patterns 20;
- wherein two adjacent via holes 301 are arranged in the preset direction a, and correspond to respective two pixel patterns 20 that are spaced apart and arranged in the preset direction a, and are required to be formed by the substrate 50 to be evaporated;
- on the mask plate body 300, the minimum distance between the two adjacent via holes 301 arranged in the preset direction a is greater than or equal to a size of the pixel pattern 20 in the preset direction a, and is less than or equal to a maximum size of the via hole 301 in the preset direction a.

With reference to FIG. 2, taking the example that the VSS wiring 40 is arranged on the substrate 50 to be evaporated along two opposite edges of the substrate 50 to be evaporated, optionally, the preset direction a is perpendicular to the two opposite edges. The substrate 50 to be evaporated to be manufactured includes the plurality of columns of pixel patterns 20 arranged in the preset direction a, and in each column of pixel patterns 20 arranged in the preset direction a, each pixel pattern 20 is connected to an adjacent pixel pattern 20 via a connected connection pattern 30 so as to enable each pixel pattern 20 of the whole column to be connected to the VSS wiring 40.

As shown in connection with FIGS. 2 and 3, in the embodiment of the present disclosure, the mask plate body 300 of the mask plate includes the plurality of via holes 301 distributed at intervals, and each via hole 301 is configured for both penetrating therethrough the evaporated material to form the pixel patterns 20 on the substrate 50 to be evaporated and forming the connection patterns 30 of the pixel patterns 20 parallel to the preset direction a, so that the via hole 301 is formed in a different shape as compared with the pixel patterns 20 formed on the substrate 50 to be evaporated.

Furthermore, in the embodiment of the present disclosure, on the mask plate body 300, two adjacent via holes 301 arranged in the preset direction a are in one-to-one correspondence with two pixel patterns 20 that are spaced apart and arranged in the preset direction a, and are required to be formed on the substrate 50 to be evaporated. For example, the first via hole 3011 and the second via hole 3012 that are arranged in the preset direction a and adjacent to each other on the mask plate body 300 respectively correspond to the first pixel patterns 2001 and the second pixel patterns 2002 which are spaced apart and arranged in the preset direction a and are required to be formed on the substrate 50 to be evaporated. That is, specifically, the first via hole 3011 is configured for enabling the evaporation material to penetrating therethrough to form the first pixel patterns 2001, and the second via hole 3012 is configured for enabling the evaporation material to penetrating therethrough to form the second pixel patterns 2002.

In addition, in this implementation, the first via hole 3011 is further configured for enabling the evaporation material to penetrate therethrough, to form the connection pattern 30 where the first pixel pattern 2001 is connected to the third pixel pattern 2003, and the second via hole 3012 is further configured for enabling the evaporation material to penetrate therethrough, to form the connection pattern 30 where the second pixel pattern 2002 is connected to the fourth pixel pattern 2004, wherein the third pixel pattern 2003 is located at one side of the first pixel patterns 2001 in the preset direction a, and the fourth pixel pattern 2004 is located at one side of the second pixel patterns 2002 in the preset direction a.

In the embodiment of the present disclosure, as shown in FIG. 3, combined with FIG. 2, on the mask plate body 300, the minimum distance b between two adjacent via holes 301 arranged in the preset direction a is greater than or equal to the size c of the pixel pattern 20 in the preset direction a, and less than or equal to the maximum size d of the via hole 301 in the preset direction a.

In the embodiment of the present disclosure, as shown in conjunction with FIGS. 2 and 3, each of the via holes 301 includes:

- a main hole 310 and an extension hole 320 which is connected to the main hole 310 and is parallel to the preset direction a, wherein the main hole 310 is configured for penetrating therethrough the evaporated material to form the pixel pattern 20, and the extension hole 320 is configured for penetrating therethrough the evaporated material to form the connection pattern 30 of the pixel pattern 20.

In an embodiment, as shown in FIG. 3, the extension hole 320 is arranged in the preset direction a with respect to the main hole 310, i.e., protruding in the preset direction a with respect to the main hole 310 connected thereto.

It should be noted that, the preset direction a mentioned in the embodiments of the present disclosure is a direction from the main hole 310 toward one side thereof, and the extension hole 320 is provided in the preset direction a, that is, the extension hole 320 extends and protrudes toward the preset direction a with respect to the main hole 310.

In this embodiment, optionally, the extension hole 320 of each via hole 301 protrudes in the preset direction a with respect to the main hole 310 connected thereto, i.e., facing the same side of the main hole 310.

In this embodiment, as shown in FIG. 3, taking a first via hole 3011 and a second via hole 3012 arranged in the preset direction a as an example, the minimum distance b between two adjacent via holes 301 arranged in the preset direction a is: the perpendicular distance between the main hole 310 of the second via hole 3012 proximate to the inner wall surface of the first via hole 3011 and the extension hole 320 of the first via hole 3011 proximate to the inner wall surface of the second via hole 3012.

Further, the maximum size d of the via holes 301 in the preset direction a is: the distance between the inner wall surface of the main hole 310 distal to the extension hole 320 and the inner wall surface of the extension hole 320 distal to the main hole 310, wherein the main hole 310 and the extension hole 320 belong to the same via hole 301.

Figure 4:
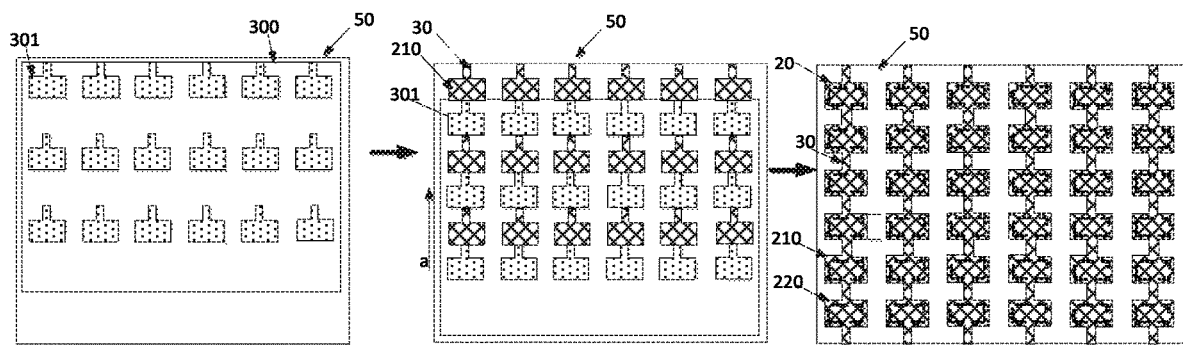
FIG. 4 is a schematic diagram of an evaporation process using the mask plate of the implementation shown in FIG. 3.

By adopting the mask plate with the structure described in the embodiment, in conjunction with FIGS. 2 and 4, when the substrate 50 to be evaporated is formed into a plurality of pixel patterns 20, the mask plate body 300 and the substrate 50 to be evaporated can be aligned firstly, and then the first evaporation process is performed, so that the evaporated material is deposited on the substrate 50 to be evaporated through the plurality of via holes 301 on the mask plate body 300; and a plurality of columns of a plurality of first pixel patterns 210 arranged in the preset direction and connection patterns 30 connected to respective first pixel patterns 210 are formed on the substrate 50 to be evaporated. The substrate 50 to be evaporated that is formed by using the first evaporation process also reserves a preparation space for the pixel pattern 20 to be formed between two adjacent first pixel patterns 210 arranged in the preset direction a in each column, as compared with the substrate 50 to be evaporated that is to be formed; therefore, among the formed first pixel patterns 210, the mask plate body 300 is translated towards the preset direction a by the preset distance, so that each of the plurality of via holes 301 is aligned with the respective reserved preparation space between the two adjacent first pixel patterns 210 on the substrate 50 to be evaporated, and the second evaporation process is performed; the second pixel pattern 220 and the connection pattern 30 connected to the second pixel pattern 220 can be formed between two adjacent first pixel patterns 210 in each column of the plurality of first pixel patterns 210 in the preset direction a by enabling the evaporated material to penetrate through the plurality of via holes on the mask plate body 300, and the second pixel pattern 220 can be connected to the adjacent first pixel pattern 210 by using the connection pattern 30 of the first pixel pattern 210 and the connection pattern 30 of the second pixel pattern 220, thereby forming the electrode layer as shown in FIG. 2 on the substrate 50 to be evaporated.

In the embodiments of the present disclosure, the minimum distance b between two adjacent via holes 301 arranged in the preset direction a is greater than or equal to the size c of the pixel pattern 20 in the preset direction a, such that after one evaporation process, the evaporation region of the second pixel pattern 220 required to be formed between the two first pixel patterns 210 can be reserved between the first pixel patterns 210 formed by the evaporation that correspond to the two adjacent via holes 301 arranged in the preset direction a; furthermore, the minimum distance b between two adjacent via holes 301 arranged in the preset direction is a smaller than or equal to the maximum size of the via hole 301 in the preset direction a, such that the first pixel pattern 210 and the second pixel patterns 220 formed by the respective evaporations can be connected to each other via the connection pattern 30 without a separation space.

In the embodiment shown in FIG. 3, the extension hole 320 of each via hole 301 is arranged in the preset direction a with respect to the main hole 310 connected thereto; therefore, in order to ensure that the adjacent first pixel pattern 210 and second pixel pattern 220 formed by the respective evaporations can be connected to each other via the connection patterns 30, the size of the extension hole 320 in the preset direction a is greater than or equal to a distance between two adjacent pixel patterns 20 in the preset direction a on the substrate 50 to be evaporated.

Optionally, in this embodiment, the central line of the main hole 310 in the preset direction a coincides with the central line of the extension hole 320 in the preset direction a.

Optionally, in this embodiment, the shape and size of each pixel pattern 20 required to be formed on the substrate 50 to be evaporated are the same; accordingly, on the mask plate body 300, the shape and size of each via hole 301 are the same; on this basis, when there is a first distance between the central lines of the main holes 310 of two adjacent via holes 301 arranged in the preset direction a on the mask plate body 300, and when there is a second distance between the central lines of two adjacent pixel patterns 20 in the preset direction a to be formed on the substrate 50 to be evaporated, and the first distance is twice the second distance. Referring to FIG. 4, after the plurality of first pixel patterns 210 are formed by performing the first evaporation process, the second pixel pattern 220 can be formed between two adjacent first pixel patterns 210 arranged in the preset direction a by translating the second distance in the preset direction a.

It should be noted that, in the mask plate according to the embodiment of the present disclosure, the shape of the via hole 301 provided in the mask plate body 300 is not limited to that shown in FIG. 3.

Figure 5:
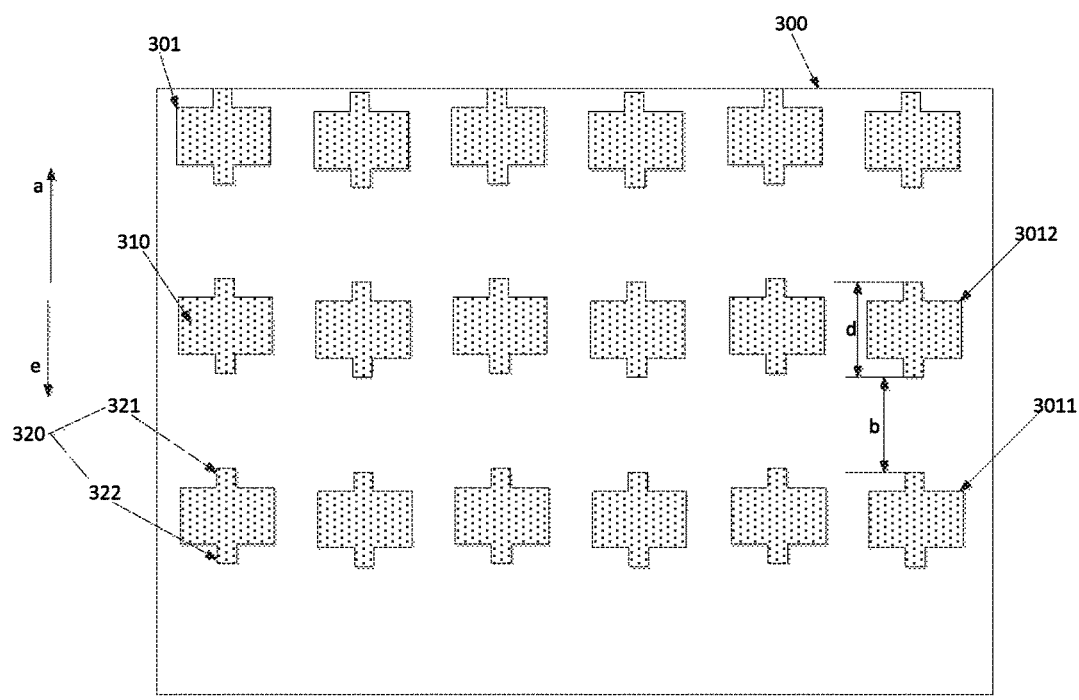
FIG. 5 is a schematic structural diagram showing the mask plate according to another implementation of the embodiments of the present disclosure.

The embodiment of the present disclosure also provides the mask plate of another embodiment as shown in FIG. 5, in which: as in the previous embodiment, and as shown in connection with FIG. 2, the mask plate body 300 includes the plurality of via holes 301 distributed at intervals, and the via holes 301 are configured for penetrating therethrough the evaporated material so as to form the pixel patterns 20 on the substrate to be evaporated and connection patterns 30 parallel to direction a, and the connection patterns 30 are connected to the pixel patterns 20.

Each of the via holes 301 includes:
the main hole 310 and the extension hole 320 which is connected to the main hole 310 and is parallel to the preset direction a, wherein the main hole 310 is configured for penetrating therethrough the evaporated material to form the pixel patterns 20, and the extension hole 320 is configured for penetrating therethrough the evaporated material to form the connection patterns 30 of the pixel patterns 20.

In this embodiment, the extension hole 320 includes: the first extension hole 321 arranged in the preset direction a with respect to the main hole 310, and the second extension hole 322 arranged in a direction e opposite to the preset direction a with respect to the main hole 310.

By using this embodiment, each via hole 301 is in the shape of a plus sign.

Based on this embodiment, as shown in FIGS. 5 and 2, on the mask plate body 300, two adjacent via holes 301 arranged in the preset direction a are in one-to-one correspondence with two pixel patterns 20 that being spaced apart and arranged in the preset direction a, and being required to be formed on the substrate 50 to be evaporated. By way of example, the first via hole 3011 and the second via hole 3012 arranged in the preset direction a and adjacent to each other on the mask plate body 300 respectively correspond to the first pixel pattern 2001 and the second pixel pattern 2002 which are spaced apart and arranged in the preset direction a and are required to be formed on the substrate 50 to be evaporated. That is, specifically, the first via hole 3011 is configured for forming the first pixel pattern 2001 through the evaporation material, and the second via hole 3012 is configured for forming the second pixel pattern 2002 through the evaporation material.

On this basis, in this embodiment, the first via hole 3011 is also configured to allow the evaporation material to penetrate therethrough to form at least a part of the connection pattern 30 where the first pixel pattern 2001 is connected to the third pixel pattern 2003, and at least a part of the connection pattern 30 where the first pixel pattern 2001 is connected to the fifth pixel pattern 2005; the second via hole 3012 is also configured to penetrate the evaporated material therethrough to form at least a part of the connection pattern 30 where the second pixel pattern 2002 is connected to the fourth pixel pattern 2004, and at least a part of the connection pattern 30 where the second pixel pattern 2002 is connected to the third pixel pattern 2003. Here, the third pixel pattern 2003 is located at a side of the first pixel pattern 2001 in the preset direction a, the fifth pixel pattern 2005 is located at a side of the first pixel pattern 2005 in the direction e opposite to the preset direction a, and the fourth pixel pattern 2004 is located at a side of the second pixel pattern 2002 in the preset direction a.

Therefore, in this embodiment, at least the part of the connection pattern 30 on the opposite side of the pixel pattern 20 can be formed through the transmittance of the evaporated material by providing the extension holes 320 on the opposite two sides of the main hole 310, respectively.

In the disclosed embodiment, optionally, as shown in FIG. 5, the main hole 310 includes the central line parallel to the preset direction a, and the first and second extension holes 321 and 322 are each of a symmetrical structure with respect to the central line. That is, the respective central lines of the main hole 310, the first extension hole 321, and the second extension hole 322 in the preset direction a coincide each other.

As shown in FIG. 5, taking the first via hole 3011 and the second via hole 3012 arranged in the preset direction a as an example, the minimum distance b between two adjacent via holes 301 arranged in the preset direction a is: the distance between the second extension hole 322 of the second via hole 3012 adjacent to the inner wall surface of the first via hole 3011 and the first extension hole 321 of the first via hole 3011 adjacent to the inner wall surface of the second via hole 3012.

Further, the maximum size d of the via hole 301 in the preset direction a is: the distance between the inner wall surface of the first extension hole 321 distal to the second extension hole 322 and the inner wall surface of the second extension hole 322 distal to the first extension hole 321, wherein the main hole 310 and the extension hole 320 belong to the same via hole 301.

Figure 6:
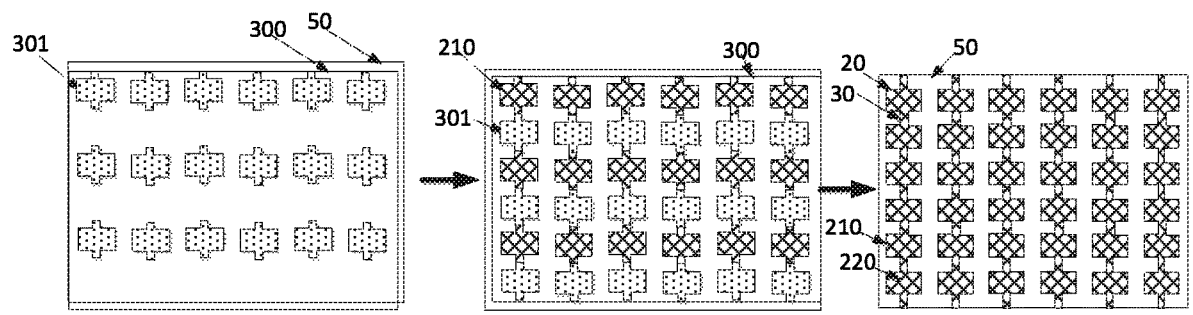
FIG. 6 is a schematic diagram of an evaporation process using the mask plate of the implementation shown in FIG. 5.

By adopting the mask plate with the structure described in the embodiment, in conjunction with FIGS. 2 and 6, when a plurality of pixel patterns 20 is to be formed on the substrate 50 to be evaporated, the mask plate body 300 and the substrate 50 to be evaporated can be aligned firstly, and then the first evaporation process is performed, so that the evaporated material is deposited on the substrate 50 to be evaporated through the plurality of via holes 301 on the mask plate body 300; and a plurality of columns of a plurality of first pixel patterns 210 and at least the part of the respective connection patterns 30 which are connected to each first pixel pattern 210 and extended to two sides thereof are formed on the substrate 50 to be evaporated.

The substrate 50 to be evaporated that is formed by using the first evaporation process also reserves a preparation space of the pixel pattern 20 to be formed between two adjacent first pixel patterns 210 arranged in the preset direction a in each column, as compared with the substrate 50 to be evaporated that is to be formed; therefore, among the formed first pixel patterns 210, the mask plate body 300 is translated towards the preset direction a by the preset distance, so that each of the plurality of via holes 301 is aligned with the respective reserved preparation space between the two adjacent first pixel patterns 210 on the substrate 50 to be evaporated, and the second evaporation process is performed, such that the second pixel pattern 220 and at least a part of the connection pattern 30 connected to the second pixel pattern 220 can be formed between two adjacent first pixel patterns 210 in each column of the plurality of first pixel patterns 210 in the preset direction a by enabling the evaporated material to penetrate through the plurality of via holes on the mask plate body 300, and the part of the connection patterns 30 is connected to the connection patterns 30 of the first pixel patterns 210 formed in the first evaporation step, and therefore the connection pattern 30 of the first pixel pattern 210 and the connection pattern 30 of the second pixel pattern 220 are used; and the second pixel pattern 220 can be connected to the adjacent first pixel pattern 210 to form the electrode layer shown in FIG. 2 on the substrate 50 to be evaporated.

Therefore, in this embodiment, by enabling the minimum distance b between two adjacent via holes 301 arranged in the preset direction a to be greater than or equal to the size c of the pixel pattern 20 in the preset direction a, it can be ensured that after one evaporation, the evaporation region of the second pixel patterns 220 required to be formed between the two first pixel patterns 210 can be reserved between the first pixel patterns 210 formed by the evaporation corresponding to the two adjacent via holes 301 arranged in the preset direction a; furthermore, by forming the minimum distance b between two adjacent via holes 301 arranged in the preset direction a smaller than or equal to the maximum size of the via hole 301 in the preset direction a, it can be ensured that the first pixel pattern 210 and the second pixel pattern 220 formed by the respective evaporations can be connected to each other via the connection pattern 30 without generating a separation space.

In this embodiment, in order to prevent the arrangement of the first extension hole 321 and the second extension hole 322 from adversely affecting the forming of the pixel patterns 210 through evaporation, the sizes of the first extension hole 321 and the second extension hole 322 in the preset direction a are both less than or equal to a distance between two adjacent pixel patterns 20 in the preset direction a on the substrate 500 to be evaporated.

Optionally, the size of the first extension hole 321 in the preset direction a is equal to the size of the second extension hole 322 in the preset direction a.

Further, in this embodiment, the shape and size of each pixel pattern 20 required to be formed on the substrate 50 to be evaporated are the same; accordingly, on the mask plate body 300, the shape and size of each via hole 301 are the same; on this basis, when there is a first distance between the central lines of the main holes 310 of two adjacent via holes 301 arranged in the preset direction a on the mask plate body 300, and when there is a second distance between the central lines of two adjacent pixel patterns 20 in the preset direction a required to be formed on the substrate 50 to be evaporated, the first distance is twice the second distance. Referring to FIG. 6, after the plurality of first pixel patterns 210 are formed by performing the first evaporation process, the second pixel patterns 220 can be formed between two adjacent first pixel patterns 210 arranged in the preset direction a by translating the second distance in the preset direction a.

In the embodiment of the present disclosure, optionally, the inner wall surface of the first extension hole 321 distal to the second extension hole 322 is the plane or the arc surface; the inner wall surface of the second extension hole 322 distal to the first extension hole 321 is the flat surface or the arc surface, and by providing the arc surface, the length of the corresponding extension hole with the arc surface is greater than the length of the corresponding extension hole with the flat surface. It should be noted that the shape of the inner wall surface is not particularly limited as long as the evaporation process is not affected.

By using the mask plate according to the embodiment of the present disclosure, a patterned material layer can be formed on the substrate to be evaporated by performing two evaporation processes using one mask plate, i.e., the two evaporation processes are implemented without replacing the mask plate. Compared with the two evaporation processes using two different mask plates in the prior art, the evaporation process can be simplified and the evaporation time of the evaporation machine can be saved.

In addition, according to the mask plate according to the embodiment of the present disclosure, the via holes 301 are separated from each other on the mask plate body 300, so that the mask plate can be manufactured with high strength.

Figure 7:
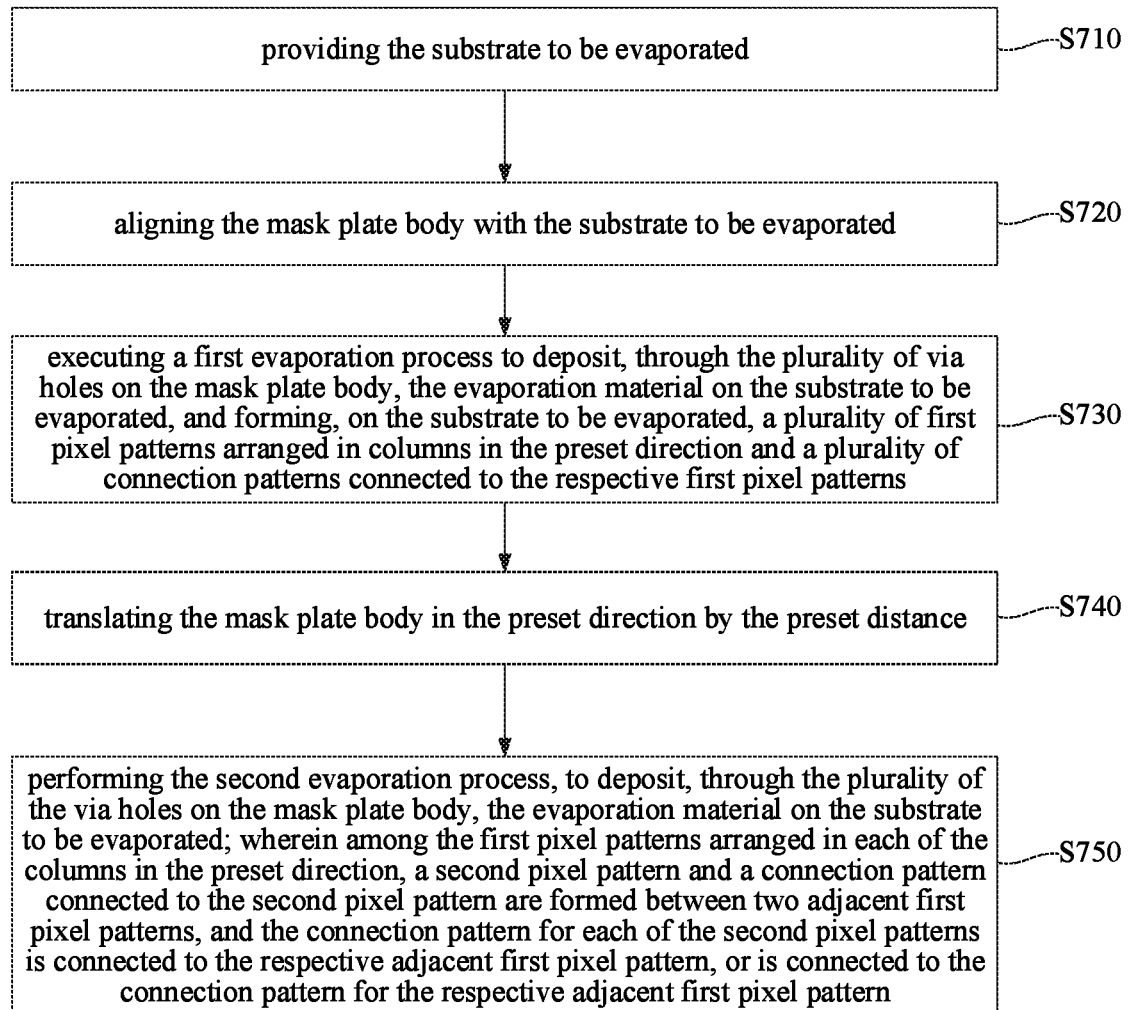
FIG. 7 is a flowchart of an evaporation process using a mask plate according to an embodiment of the present disclosure.

The embodiments of the present disclosure further provide a method for performing evaporation by using the above mask plate, as shown in FIG. 7, in conjunction with FIGS. 3 and 5, the method includes:

S710, providing the substrate to be evaporated;

S720, aligning the mask plate body with the substrate to be evaporated;

S730, executing a first evaporation process to deposit, through the plurality of via holes on the mask plate body, the evaporation material on the substrate to be evaporated, and forming, on the substrate to be evaporated, a plurality of first pixel patterns arranged in columns in the preset direction and a plurality of connection patterns connected to the respective first pixel patterns;

S740, translating the mask plate body in the preset direction by the preset distance; and S750, performing the second evaporation process, to deposit, through the plurality of the via holes on the mask plate body, the evaporation material on the substrate to be evaporated; wherein among the first pixel patterns arranged in each of the columns in the preset direction, a second pixel pattern and a connection pattern connected to the second pixel pattern are formed between two adjacent first pixel patterns, and the connection pattern for each of the second pixel patterns is connected to the respective adjacent first pixel pattern, or is connected to the connection pattern for the respective adjacent first pixel pattern.

Optionally, the preset distance is equal to a distance between a first central line of the first pixel pattern and a second central line of the second pixel pattern;

the first central line is a central line of the first pixel pattern perpendicular to the preset direction; and the second central line is the central line of the second pixel pattern perpendicular to the preset direction.

Optionally, the plurality of first pixel patterns and the plurality of the second pixel patterns formed on the substrate to be evaporated are combined to form a cathode layer of an OLED light emitting unit.

Methods, specific principles and procedures for performing evaporation by using the mask plate according to embodiments of the present disclosure may be referred to those in the above description and will not be described in detail herein.

In the evaporation method according to the embodiments of the present disclosure, the patterned material layer can be formed on the substrate to be evaporated by performing two evaporation process with one mask plate, i.e., without changing the mask plate. As compared with the two evaporation process with two different mask plates in the prior art, the evaporation process can be simplified and the evaporation time of the evaporation machine can be saved.

While the foregoing is directed to alternative embodiments of the present disclosure, it should be understood by those skilled in the art that various improvements and modifications may be made without departing from the principle of the present disclosure, and theses improvement and modifications shall fall within the scope of protection of the present disclosure.

What is claimed is:

1. A mask plate, comprising:
a mask plate body comprising a plurality of via holes arranged at intervals, wherein the via hole comprises a main hole and an extension hole, the extension hole is connected to the main hole and is parallel to a preset direction, the main hole is configured for enabling evaporated material to penetrating therethrough, to form a pixel pattern on a substrate to be evaporated, and the extension hole is configured for enabling the evaporated material to penetrate therethrough, to form a connection pattern for the pixel pattern, and the connection pattern is connected to the pixel pattern,
wherein two adjacent ones of the via holes arranged in the preset direction correspond to respective two pixel patterns, and the respective two pixel patterns are to be formed on the substrate to be evaporated, are arranged in the preset direction, and are arranged at intervals;
on the mask plate body, a minimum distance between two adjacent via holes arranged in the preset direction is greater than or equal to a size of the pixel pattern in the preset direction, and is less than or equal to a maximum size of the via hole in the preset direction;
all of the via holes of the mask plate body are arranged in one array consisting of rows and columns;
the via holes in one of the rows are aligned with the via holes in another one of the rows in the preset direction, respectively;
the via holes in one of the columns are aligned with the via holes in another one of the columns in a direct perpendicular to the preset direction, respectively;
the one of the rows is next to the other one of the rows, and the one of the columns is next to the other one of the columns;
the extension hole comprises a first extension hole and a second extension hole;
each of the via holes consists of one first extension hole, one second extension hole, and one main hole that are continuous;
the via holes are spaced apart from each other at a predetermined interval;
the first extension hole protrudes in the preset direction with respect to the respective main hole that the first extension hole is connected to, the second extension hole protrudes in an opposite direction with respect to the respective main hole that the second extension hole is connected to, the opposite direction is opposite to the preset direction;

a sum of an area of the first extension hole and an area of the second extension hole is less than an area of the main hole;

a center line of the main hole in the preset direction, a center line of the first extension hole in the preset direction, and a center line of the second extension hole in the preset direction coincide with each other.

2. The mask plate according to claim 1, wherein a size of the first extension hole in the preset direction is greater than or equal to a distance between two adjacent pixel patterns arranged in the preset direction and arranged on the substrate to be evaporated.

3. The mask plate according to claim 1, wherein each of a size of the first extension hole and a size of the second extension hole in the preset direction is less than or equal to a distance between two adjacent pixel patterns arranged in the preset direction and arranged on the substrate to be evaporated.

4. The mask plate according to claim 3, wherein the size of the first extension hole in the preset direction is equal to the size of the second extension hole in the preset direction.

5. The mask plate according to claim 3, wherein each of the first and second extension holes is of a symmetrical structure with respect to the central line.

6. The mask plate according to claim 3, wherein an inner wall surface of the first extension hole is a flat surface or an arc surface, an inner wall surface of the second extension hole is the flat surface or the arc surface, the inner wall surface of the first extension hole is distal to the second extension hole, and the inner wall surface of the second extension hole is distal to the first extension hole.

7. The mask plate according to claim 1, wherein each of the via holes is of a same shape and a same size.

8. A method for performing evaporation by using the mask plate according to claim 1, wherein the method comprises:

providing the substrate to be evaporated;

aligning the mask plate body with the substrate to be evaporated;

executing a first evaporation process to deposit, through the plurality of via holes on the mask plate body, the evaporation material on the substrate to be evaporated, and forming, on the substrate to be evaporated, a plurality of first pixel patterns arranged in columns in the preset direction and a plurality of connection patterns connected to the respective first pixel patterns;

translating the mask plate body in the preset direction by the preset distance; and performing the second evaporation process, to deposit, through the plurality of the via holes on the mask plate body, the evaporation material on the substrate to be evaporated; wherein among the first pixel patterns arranged in each of the columns in the preset direction, a second pixel pattern and a connection pattern connected to the second pixel pattern are formed between two adjacent first pixel patterns, and the connection pattern for each of the second pixel patterns is connected to the respective adjacent first pixel pattern, or is connected to the connection pattern for the respective adjacent first pixel pattern.

9. The method according to claim 8, wherein the preset distance is equal to a distance between a first central line of the first pixel pattern and a second central line of the second pixel pattern;

the first central line is perpendicular to the preset direction; and the second central line is perpendicular to the preset direction.

10. The method according to claim 8, wherein the plurality of first pixel patterns and the plurality of the second pixel patterns formed on the substrate to be evaporated are combined to form a cathode layer of an Organic Light-Emitting Diode (OLED) light emitting unit.

11. The mask plate according to claim 4, wherein each of the first and second extension holes is of a symmetrical structure with respect to the central line.

12. The mask plate according to claim 4, wherein an inner wall surface of the first extension hole is a flat surface or an arc surface, an inner wall surface of the second extension hole is the flat surface or the arc surface, the inner wall surface of the first extension hole is distal to the second extension hole, and the inner wall surface of the second extension hole is distal to the first extension hole.

13. The method according to claim 8, wherein a size of the first extension hole in the preset direction is greater than or equal to a distance between two adjacent pixel patterns arranged in the preset direction and arranged on the substrate to be evaporated.

14. The method according to claim 8, wherein each of a size of the first extension hole and a size of the second extension hole in the preset direction is less than or equal to a distance between two adjacent pixel patterns arranged in the preset direction and arranged on the substrate to be evaporated.

15. The method according to claim 14, wherein the size of the first extension hole in the preset direction is equal to the size of the second extension hole in the preset direction.

16. The method according to claim 14, wherein each of the first and second extension holes is of a symmetrical structure with respect to the central line.

* * * * *